(12) United States Patent
Shiraishi et al.

(10) Patent No.: US 7,515,817 B2
(45) Date of Patent: Apr. 7, 2009

(54) CAMERA MODULE

(75) Inventors: Satoshi Shiraishi, Nagano (JP); Yoichi Kazama, Nagano (JP); Tomohiro Furukawa, Nagano (JP); Tominari Kojima, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 371 days.

(21) Appl. No.: 11/380,125

(22) Filed: Apr. 25, 2006

(65) Prior Publication Data

US 2006/0239671 A1   Oct. 26, 2006

(30) Foreign Application Priority Data

Apr. 26, 2005  (JP)  .............. 2005-127978

(51) Int. Cl.
  *G03B 3/00* (2006.01)
  *G03B 17/00* (2006.01)
(52) U.S. Cl. .................... 396/89; 396/542
(58) Field of Classification Search ........... 396/89, 396/542; 348/340, 345, 373–376
See application file for complete search history.

(56) References Cited

U.S. PATENT DOCUMENTS

| 4,864,348 | A | * | 9/1989 | Fujiwara et al. | ............. 396/542 |
| 5,581,412 | A | * | 12/1996 | Tanaka | ...................... 359/697 |
| 7,131,773 | B2 | * | 11/2006 | Sakamoto | ................... 396/462 |
| 7,340,161 | B2 | * | 3/2008 | Asai et al. | .................... 396/89 |
| 2004/0038719 | A1 | * | 2/2004 | Lee | ......................... 455/575.7 |

FOREIGN PATENT DOCUMENTS

| JP | 2003-60177 | 2/2003 |
| JP | 2004-147032 | 5/2004 |
| JP | 2005-26561 | 1/2005 |

* cited by examiner

*Primary Examiner*—W. B. Perkey
*Assistant Examiner*—Minh Phan
(74) *Attorney, Agent, or Firm*—Rankin, Hill & Clark LLP

(57) ABSTRACT

A camera module is provided wherein an image pickup device, a camera optical system and a driver, for aligning and focusing the camera optical system, are mounted on a board; wherein a connection terminal, to be electrically connected to the driver, is formed on a mounting face of the board; and wherein the connection terminal formed on the board is connected to the driver via a flexible wiring board.

8 Claims, 6 Drawing Sheets

CAMERA MODULE

The present application claims foreign priority under 35 USC 119 based on Japanese Patent Application No. 2005-127978, filed Apr. 26, 2005, the content of which is incorporated herein by reference.

BACKGROUND OF THE INVENTION

1. Technical Field

The present invention relates to a camera module, and relates more particularly to a camera module having an autofocus function.

2. Related Art

Various models are available of camera modules on which an image pickup device, such as a CCD or a CMOS, is mounted (see, for example, patent documents 1 and 2). For these camera modules, not only are fixed-focused products available, but products having an autofocus function have also begun to be provided.

FIG. 9 is a diagram showing an example configuration for a camera module that includes an autofocus function and a shutter function. A camera module 5 comprises: an image pickup device 12, mounted on a board 10; and an autofocus unit 20, located on the incident side of the image pickup device 12. The autofocus unit 20 incorporates a camera optical system, and a driver that finely moves the camera optical system in the light axial direction and aligns the camera optical system with the focus position. According to the arrangement of the camera module 5 in FIG. 9, an upright support rod 22 is provided on the board 10, and via the employment of a mounting portion 24, the autofocus unit 20 is supported along the light axis of the image pickup device 12.

For the autofocus unit 20, either a driver that employs an electric motor as a drive source, or one that employs a piezoelectric device as a drive source can be used to advance or retract and to position and focus the camera optical system in the light axial direction.

In either case, for a camera module having an autofocus function and a shutter function, the driver for positioning and focusing the camera optical system must be rendered conductive. Thus, in the related art, as shown in FIG. 9, one end of a flexible wiring board 6 is attached to an outer case 25 of the camera module 5 and electrically connected to the driver incorporated in the autofocus unit 20, while the other end of the flexible wiring board 6, leading away from the camera module 5, is connected to a connection terminal of a mounting board on which the camera module 5 is mounted.

[Patent Document 1] JP-A-2003-60177
[Patent Document 2] JP-A-2004-147032
[Patent Document 3] JP-A-2005-26561

In the configuration of the related-art camera module having an autofocus function and a shutter function, the flexible wiring board 6 is attached to the camera module, and is electrically connected to a connection terminal on a mounting board that is used to supply power to the autofocus unit 20. Therefore, when the camera module is actually to be mounted on the mounting board, an operation for mounting the camera module on the mounting board and a operation for bonding the flexible wiring board to the connection terminal of the mounting board are required. As a result, the processing for mounting the camera module on the mounting board becomes complicated.

Generally, soldering, a conductive paste or a conductive film, is employed to connect the flexible wiring board 6 and the connection terminal on the mounting board. However, these connection methods adversely affect work efficiency, and when the flexible wiring board and the connection terminal of the mounting board are connected using one of these methods, the reliability of the electric connection is not always satisfactory.

SUMMARY OF THE INVENTION

An object of the invention is to provide a camera module, having an autofocus function, for which the mounting operation can be simplified, and for which the reliability of an electric connection to a mounting board can be improved.

However, the present invention need not achieve the above object, and other objects not described herein may also be achieved. Further, the invention may achieve no disclosed objects without affecting the scope of the invention.

To achieve this objective, the invention includes the following configuration.

A camera module is provided wherein an image pickup device, a camera optical system and a driver, for aligning and focusing the camera optical system, are mounted on a board; wherein a connection terminal, to be electrically connected to the driver, is formed on a mounting face of the board; and wherein the connection terminal formed on the board is connected to the driver via a flexible wiring board.

The image pickup device, the camera optical system and the driver are stored in a case attached to the board, and the flexible wiring board is arranged in the case. Thus, the camera module can be made compactly, and the operation for mounting the camera module can be simplified.

Further, the camera optical system and the driver are formed as an autofocus unit, and the driver that is incorporated in the autofocus unit and the connection terminal are electrically connected via the flexible wiring board. Therefore, the camera module can be downsized even further, and imaging using auto-focusing can be performed easily.

A control mechanism for controlling a shutter is mounted in addition to the driver, a connection terminal, which is to be electrically connected to the control mechanism, is formed on the mounting face of the board, and the connection terminal and the control mechanism are electrically connected via the flexible wiring board. With this arrangement, the driver and the shutter are electrically connected to the connection terminals on the board via the flexible wiring board.

The connection terminal is formed on the mounting face of the board with the same plane arrangement as a connection electrode to be connected to the connection terminal formed on a mounting board on which the camera module is mounted. Therefore, the camera module need only be set, while aligned with the mounting board, so that the electric connection of the driver and the other component to the mounting board can be accomplished.

Terminal portions of the flexible wiring board are projected, like the teeth of a comb, from an edge portion that is to be connected to terminal connection holes that are formed in the board, and are inserted into the terminal connection holes. Further, a wiring pattern that is formed on the flexible wiring board is electrically connected to the connection terminal via a conductive material that is used to fill the terminal connection holes. Since the terminal portions, extended like the teeth of a comb, are inserted into the terminal connection holes, and the conductive material has been used to fill the terminal connection holes, the wiring pattern formed on the flexible wiring board and the connection terminal formed on the board can be stably connected, electrically.

According to the camera module of the invention, the connection terminal is formed on the mounting face of the board on which the image pickup device and the camera optical system are mounted, and the connection terminal is electrically connected to the driver that drives the camera optical system via the flexible wiring board. Therefore, the operation for mounting the camera module on the mounting board and electrically connecting the driver to a connection electrode on the mounting board can be easily performed. Therefore, the efficiency with which the camera module can be mounted can increase the efficiency with which other electronic parts are manufactured.

DETAILED DESCRIPTION OF THE INVENTION (Configuration of a Camera Module)

The preferred embodiment of the invention will now be described in detail while referring to the accompanying drawings.

Figure 1:
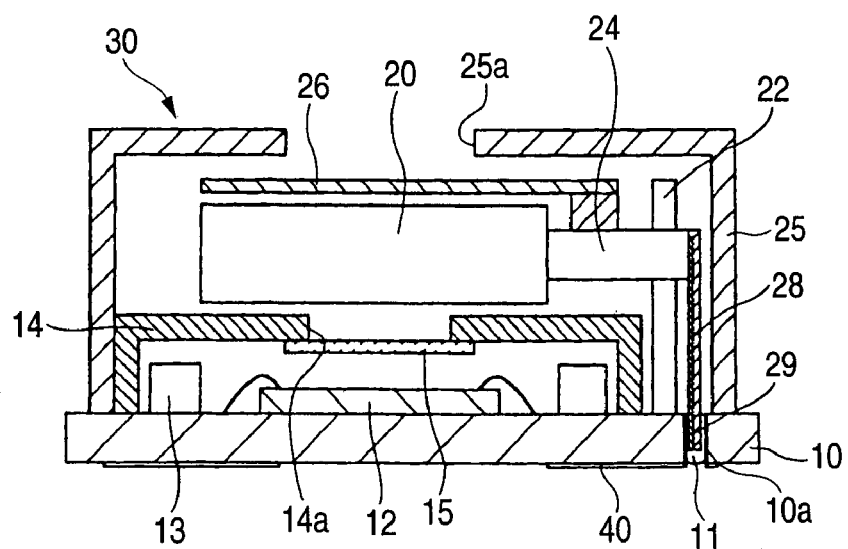
FIG. 1 is a cross-sectional view of the configuration of a camera module according to one embodiment of the invention.
Figure 9:
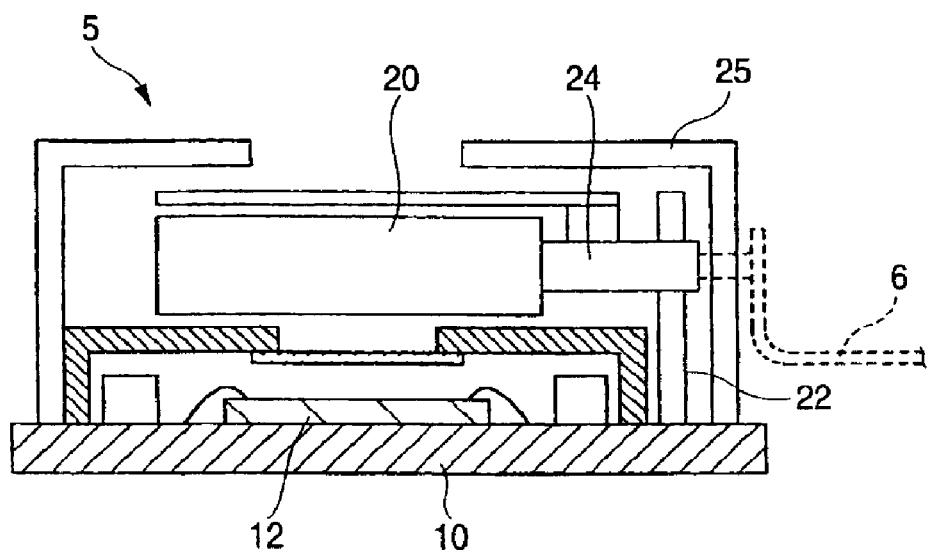
FIG. 9 is a cross-sectional view of a related-art arrangement for a camera module.

FIG. 1 is a cross-sectional view of the arrangement of a camera module according to the exemplary, non-limiting embodiment of the invention. The structures of a board 10, an image pickup device 12 and an autofocus unit 20 for a camera module 30 for this embodiment are the same as those for the related-art camera module 5 in FIG. 9, which has an autofocus function and a shutter function.

That is, the image pickup device 12 is mounted on one side of the board 10, and a chip 13 is peripherally positioned relative to the image pickup device 12. A box shaped inner case 14 is attached to enclose the image pickup device 12 and the chip 13, and an opening 14a is formed in the inner case 14, along the light axis of the image pickup device 12, while an infrared reduction filter 15 is fitted over the opening 14a on the inside of the inner case 14.

Since the bonding of the inner case 14 to the board 10 is airtight, external access to the area on the board 10 wherein the image pickup device 12 and the chip 13 are mounted is blocked. Furthermore, as external access to the area wherein the image pickup device 12 is mounted is blocked, dust or other foreign substances are prevented from entering that area, and during or after the assembly process, the attachment of a foreign substance to the light-receiving face of the image pickup device 12, which could result in a product failure, is prevented.

The autofocus unit 20 is arranged on the incident side of the infrared reduction filter 15 fitted inside the inner case 14. The autofocus unit 20 incorporates a camera optical system and a driver, for finely aligning, in the light axial direction, and focusing the camera optical system. The autofocus unit 20 is supported on the board 10 via a mounting portion 24 and an upright support rod 22 that is provided on the board 10, while the light axis of the image pickup device 12 is aligned with the light axis of the camera optical system. An electric motor or a piezoelectric device can be employed as the driver incorporated in the autofocus unit 20. Further, although in this embodiment, the camera optical system and the driver are integrally formed as a single unit, these components may be provided as separate units.

A shutter 26 is located on the incident side of the autofocus unit 20 and is supported, as is the autofocus unit 20, by the mounting portion 24. Wiring for electrifying the driver incorporated in the autofocus unit 20 and wiring for electrifying a control mechanism for the shutter 26 are provided for the mounting portion 24, and terminals 24a connected to the wiring are formed on the side face of the mounting portion 24, opposite an outer case 25.

The outer case 25 is securely bonded to the board 10 at a location whereat the inner case 14 and the autofocus unit 20 and the shutter 26, which are arranged outside the inner case 14, can be enclosed. An incident hole 25a is formed in the outer case 25 facing the shutter 26.

The characteristic configuration of the camera module 30 in this embodiment is that a connection terminal, used for electrifying the driver of the autofocus unit 20, which is formed on the mounting board on which the camera module 30 is mounted, and a connection terminal, used for electrifying the control mechanism for the shutter 26, are provided on the board 10 of the camera module 30, and that these connection terminals are electrically connected to the driver and the control mechanism via a flexible wiring board 28.

According to the camera module 30 in this embodiment, the flexible wiring board 28 is laid along the inner face of the outer case 25, and electrically connects the mounting portion 24 and the board 10.

Figure 2:
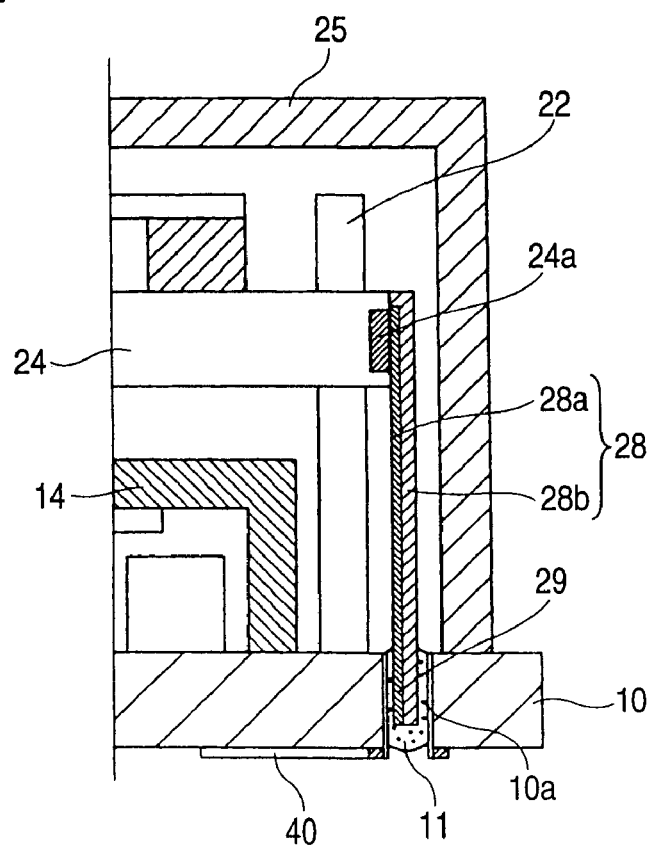
FIG. 2 is an enlarged cross-sectional view of the juncture of a flexible wiring board and a board.

FIG. 2 is an enlarged diagram showing the state wherein the flexible wiring board 28 is attached to the mounting portion 24 and the board 10.

The flexible wiring board 28 is provided by forming wiring patterns 28a on one side of an electrically insulated base film 28b. One end of each of the wiring patterns 28a is connected, using solder or a conducive adhesive, to the corresponding terminal 24a formed on the mounting portion 24, and the other end is inserted into a corresponding terminal connection hole 10a, formed in the board 10, and is electrically connected to a connection terminal 40 formed on the reverse face of the board 10. Terminal portions 29 of the flexible wiring board 28, which are inserted into the terminal connection holes 10a, are electrically connected to the connection terminal 40 by a conductive material 11, such as solder or a conductive adhesive, that is used to fill the terminal connection holes 10a.

Figure 3:
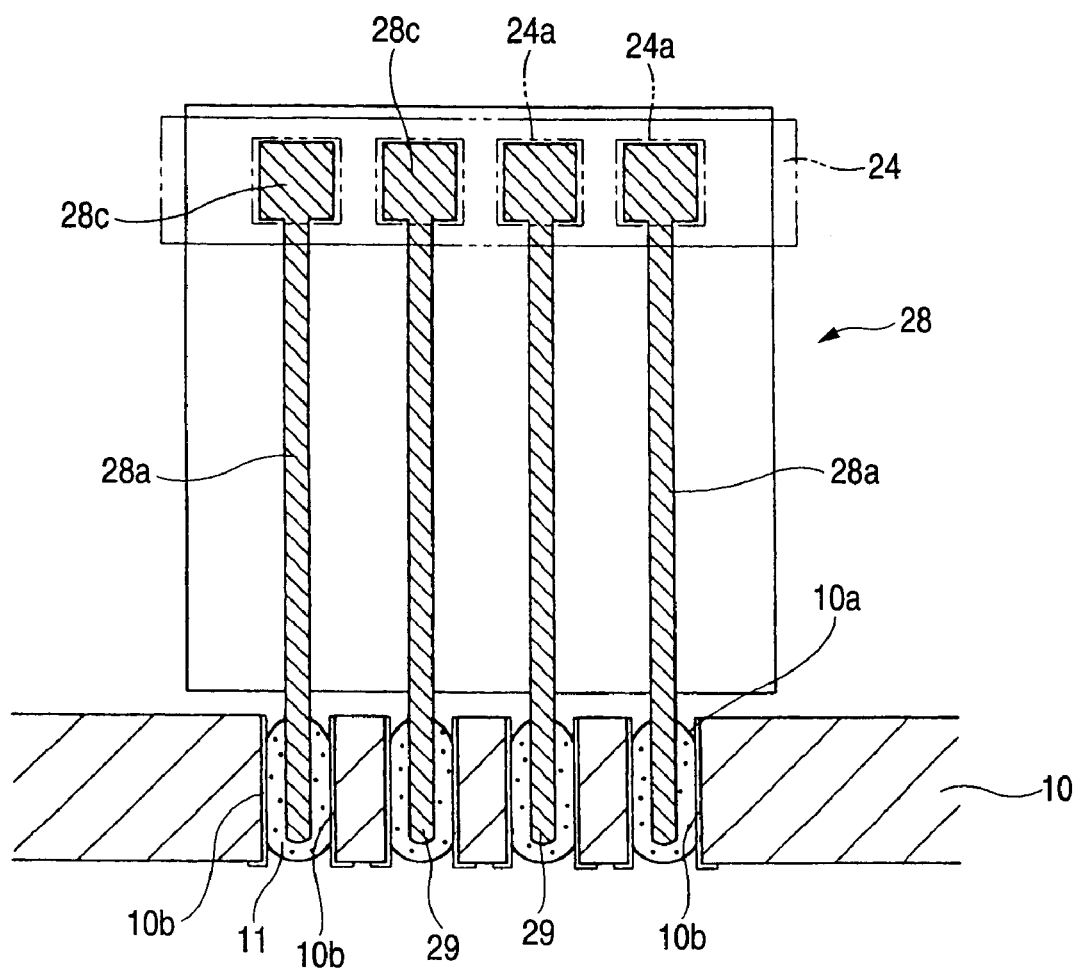
FIG. 3 is an explanatory diagram showing the juncture of the flexible wiring board and the board, viewed from the front of the flexible wiring board.

FIG. 3 is a diagram showing the state wherein the flexible wiring board 28 is attached to the board 10, as viewed from the front of the flexible wiring board 28. At the edge of the flexible wiring board 28 connected to the board 10, the comb-toothed terminal portions 29, which are formed so they are narrow enough to be inserted into the terminal connection holes 10a in the board 10, are extended, at locations corresponding with those of the terminal connection holes 10a.

The individual terminal portions 29 are formed by applying a conductive layer, which serves as the base for the formation of the wiring patterns 28a, to one side of the narrow base film 28b that is extended along the main body of the flexible wiring board 28.

The four independent wiring patterns 28a are formed on the flexible wiring board 28, and wiring portions 28c, which are to be bonded to the terminals 24a on the mounting portion 24, are formed at the ends of the individual wiring patterns 28a, and the wiring patterns 28a are extended from the wiring portions 28c to the terminal portions 29. The four wiring patterns 28a are used as wiring for electrifying the driver incorporated in the autofocus unit 20 and as wiring for electrifying the control mechanism for the shutter 26.

Figure 4A:
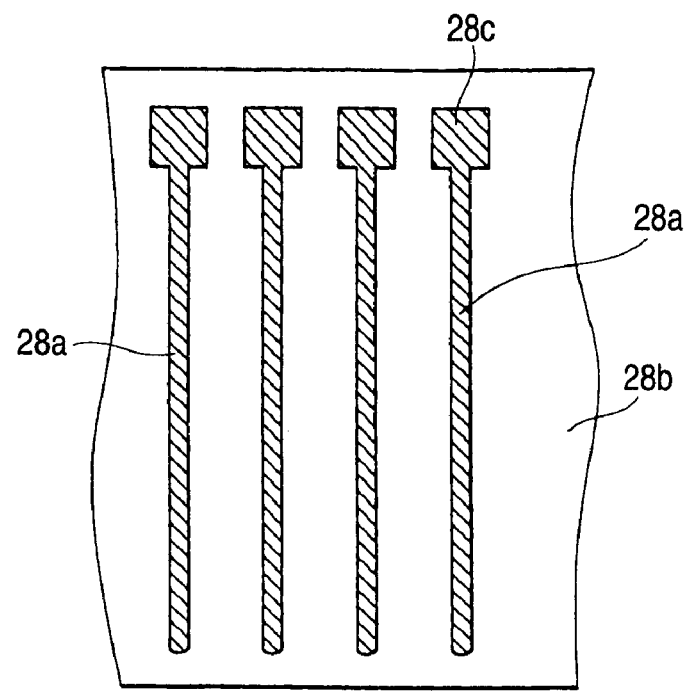
FIGS. 4A and 4B are explanatory diagrams showing a method for manufacturing the flexible wiring board.
Figure 4B:
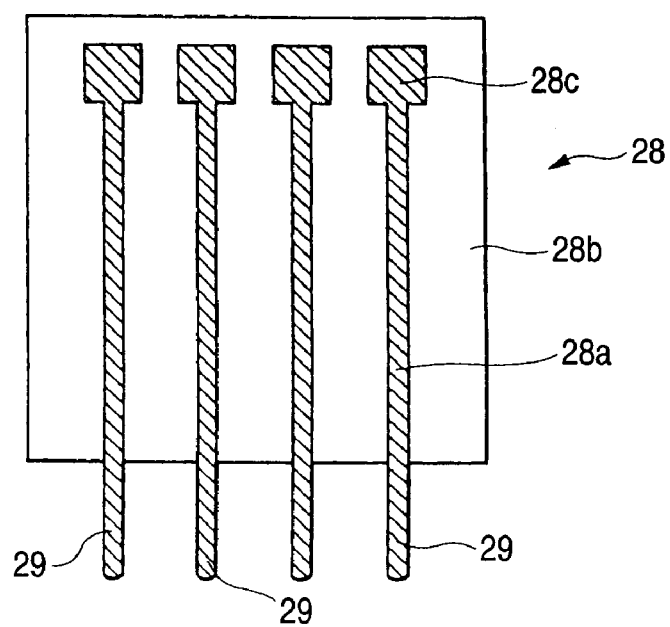

In order to manufacture the flexible wiring board 28 having the terminal portions 29, a one-side copper-clad resin film 32 is prepared by applying copper foil to one side of a flexible film, such as a polyimide film. Then, using photolithography, this copper foil is etched to form the portions that will serve as the wiring patterns 28a (FIG. 4A). Then, press-cut machining is performed for the resin film 32 to obtain the outer shape of the flexible wiring board 28, to include the terminal portions 29. Thus, the flexible wiring board 28 is obtained whereon the terminal portions 29 having the comb-shaped teeth are formed (FIG. 4B).

As shown in FIG. 3, the inner faces of the terminal connection holes 10a, into which the terminal portions 29 of the flexible wiring board 28 of the board 10 are to be inserted, are plated, and the conductive layers 10b are formed on the inner walls of the terminal connection holes 10a. The terminal portions 29, which are inserted into the terminal connection holes 10a, are electrically connected to the conductive layers 10b via the conductive material 11 used to fill the terminal connection holes 10a, and are electrically connected to the connection terminal 40, which, in turn, is electrically connected to the conductive layer 10b and is formed on the reverse face (the mounting face) of the board 10. The conductive material 11 also securely supports the terminal portions 29 within the terminal connection holes 10a.

Figure 5:
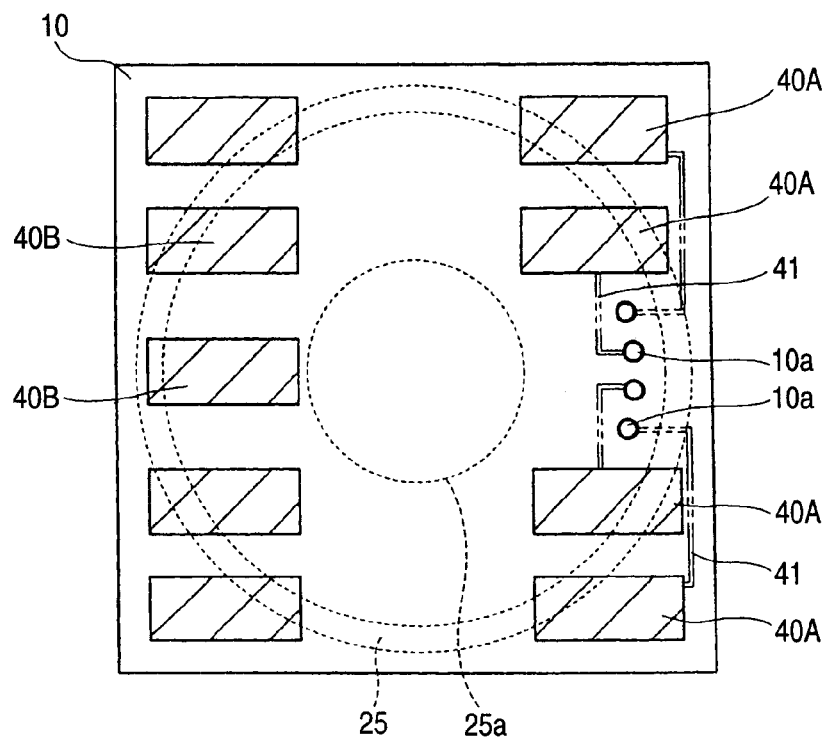
FIG. 5 is an explanatory diagram showing the board of the camera module, viewed from the bottom.

FIG. 5 is a bottom view of the camera module 30. A plurality of connection terminals 40A and 40B, which are to be connected to the mounting board, are formed on the reverse face of the board 10. The connection terminals 40A are to be electrically connected, via the flexible wiring board 28, to the driver incorporated in the autofocus unit 20 and the control mechanism of the shutter 26. The connection terminals 40B are to be electrically connected to the image pickup device 12 and to other devices mounted on the board 10.

The four terminal connection holes 10a and the connection terminals 40A on the board 10 are electrically connected via connection patterns 41.

In FIG. 5, the locations in the plan of the outer case 25 that are to be attached to the board 10 are also shown. In the plan, the outer case 25 has a circular shape, and the incident hole 25a is formed in the center of the outer case 25.

The board 10 employed for this embodiment, wherein the terminal connection holes 10a, the connection terminals 40 and the connection patterns 41 are formed, can be easily manufactured by using a conventional wiring board manufacturing method. For example, the terminal connection holes 10a can be formed in the same manner as when the conventional wiring board manufacturing method is employed to form through holes that are used to electrically connect wiring patterns that are formed on the two sides of the board. That is, by drilling through the board 10, through holes are formed for the insertion of the terminal portions 29 that are formed on the flexible wiring board 28, and plating is used to deposit a conductive layer on the inner walls of the through holes.

Further, by etching the copper foil applied to the surface of the board 10, the connection terminals 40 and the connection patterns 41 having predetermined shapes and positions can be obtained. After the connection terminals 40 and the connection patterns 41 have thus been formed, the surface of the board 10, other than those portions that must be exposed exteriorly, is covered with a protective film, such as a solder resist film. This is the same process as is performed when the conventional wiring board manufacturing method is used.

(Camera Module Assembling Method)

In order to assemble the camera module 30 of this embodiment, first, the image pickup device 12 and the chip 13 are mounted on the board 10, and the inner case 14, closed by the infrared reduction filter 15, is bonded to the board 10 to obtain an airtight seal and to enclose the image pickup device 12 and the chip 13.

Following this, the autofocus unit 20 and the shutter 26 are attached to the board 10. In this embodiment, the autofocus unit 20, the shutter 26, the mounting portion 24 and the support rod 22 are assembled in advance as a unit, and this unit is attached to the board 10. Further, during this unit assembly process, the wiring portions 28c of the flexible wiring board 28 are aligned with the terminals 24a of the mounting portion 24, and by employing solder, a conductive adhesive or an anisotropic conductive film, for example, the terminals 24a and wiring portions 28c are electrically connected and bonded to the mounting portion 24.

Further, when the unit that includes the autofocus unit 20 is mounted on the board 10, the terminal portions 29 of the flexible wiring board 28 are inserted into the terminal connection holes 10a of the board 10. Either a conductive paste, employed as the conductive material 11, is used in advance to fill the terminal connection holes 10a, or after the terminal portions 29 have been inserted into the terminal connection holes 10a, the conductive material 11, such as a conductive paste, is used to fill the terminal connection holes 10a.

After the unit that includes the autofocus unit 20 has been set up on the board 10, the outer case 25 is bonded to the board 10.

In this embodiment, a thermosetting adhesive is employed to bond the outer case 25 to the board 10, and during a heat curing process used to securely bond the outer case 25 to the board 10, the conductive material 11 used to fill the terminal connection holes 10a is also thermally set and bonds the terminal portions 29 of the flexible wiring board 28 to the board 10. In this manner, since both the operation for bonding the flexible wiring board 28 to the board 10 and the operation for bonding the outer case 25 to the board 10 are performed during one heat curing process, the assembly process for the camera module 30 that includes the flexible wiring board 28 can be efficiently performed.

(Camera Module Mounting Method)

Figure 6:
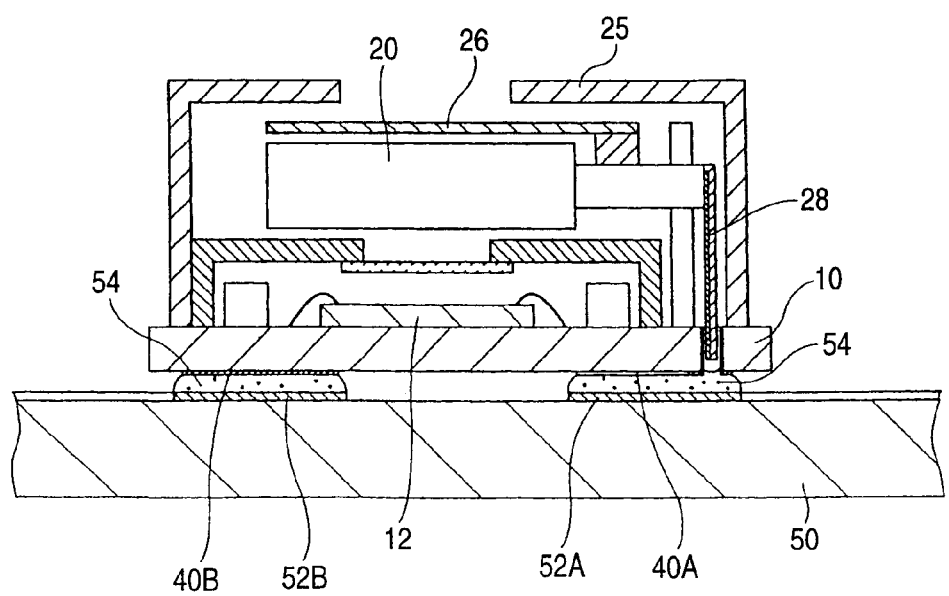
FIG. 6 is a cross-sectional view of the state wherein the camera module is mounted on a mounting board.

FIG. 6 is a diagram showing the state wherein the camera module 30 is mounted on a mounting board 50. Connection electrodes 52A and 52B are formed on the mounting board 50 at locations corresponding to the locations in the plan for the connection terminals 40A and 40B on the reverse face (the mounting face) of the board 10 of the camera module 30. The connection electrode 52A is an electrode for electrifying the driver, which is incorporated in the autofocus unit 20 of the camera module 30, and the control mechanism of the shutter 26. The connection electrode 52B is an electrode that is electrically connected to the image pickup device 12 and to other devices mounted on the board 10.

In this embodiment, using the flexible wiring board 28 incorporated in the camera module 30, the driver that adjusts the focus of the camera optical system incorporated in the autofocus unit 20 and the control mechanism that opens or closes the shutter 26 are electrically connected to the connection terminals 40A formed on the reverse face of the board 10. Therefore, the connection electrodes 52A and 52B, which are formed on the mounting board 50, are aligned with the connection terminals 40A and 40B, which are formed on the camera module 30, and these terminals and electrodes are electrically connected, so that the mounting board 50 can be electrically connected, automatically, to the autofocus unit 20 and the shutter 26 that are incorporated in the camera module 30.

Since the camera module 30 is provided as a single product, in order to mount the camera module 30 on the mounting board 50, solder paste is simply printed on the connection electrodes 52A and 52B of the mounting board 50, and reflow soldering is performed for the camera module 30, which is aligned with the mounting board 50. As described above, the operation in this embodiment for mounting the camera module 30 on the mounting board 50 is exactly the same as the conventional operation performed for the fixed-focus camera module. A complicated operation is not required to mount the camera module on the mounting board and to solder the flexible wiring board and the mounting board, and an extremely large work efficiency improvement is provided in the mounting of the camera module 30.

In addition, according to the camera module 30 of this embodiment, since the flexible wiring board 28 is incorporated in the module, the size of a camera module having an autofocus function can be reduced. And this downsizing of the camera module enables the mounting of the camera module in an extremely small area, and greatly contributes to the downsizing of an electronic apparatus.

Furthermore, in the camera module 30 of the embodiment, the terminal connection holes 10a are formed in the board 10, and the terminal portions 29 of the flexible wiring board 28 are inserted into the terminal connection holes 10a to connect the flexible wiring board 28 to the board 10. With this arrangement, the reliability and durability of the electric connection between the flexible wiring board 28 and the board 10 are increased, and the operation for bonding the flexible wiring board 28 to the board 10 is simplified.

The arrangement of the flexible wiring board 28 that connects the autofocus unit 20 to the board 10 is not limited to that shown in the embodiment.

Figure 7:
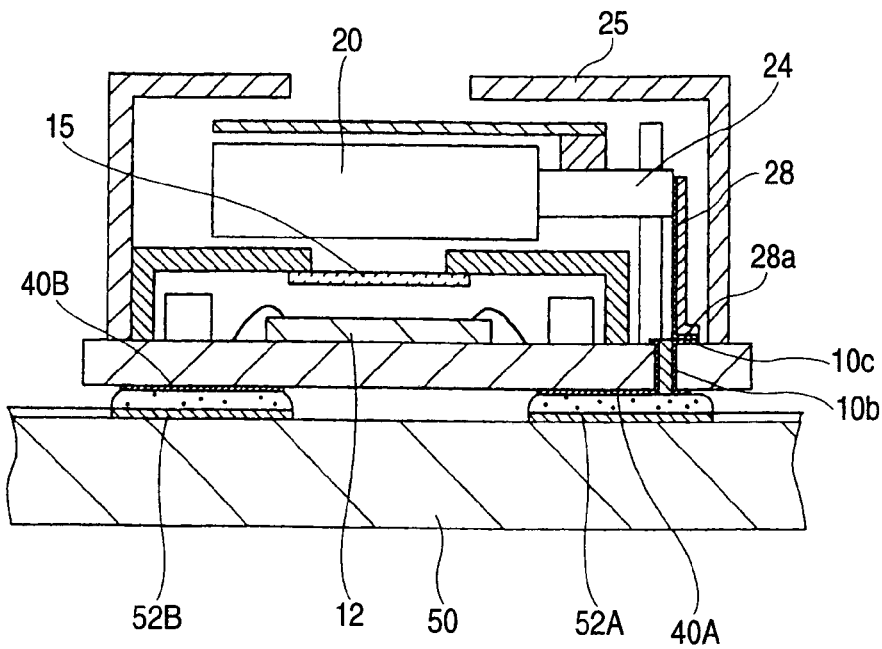
FIG. 7 is a cross-sectional view of another example mounting for the camera module.

FIG. 7 is a diagram showing an example wherein the end of the flexible wiring board 28 connected to the board 10 is bent along the surface of the board 10, and the ends of the wiring patterns 28a are bonded to connection pads 10c formed on the surface of the board 10. The connection pads 10c are electrically connected, via conductive layers 10b deposited on the inner walls of the through holes, to connection terminals 40A, which are formed on the reverse face of the board 10.

Figure 8:
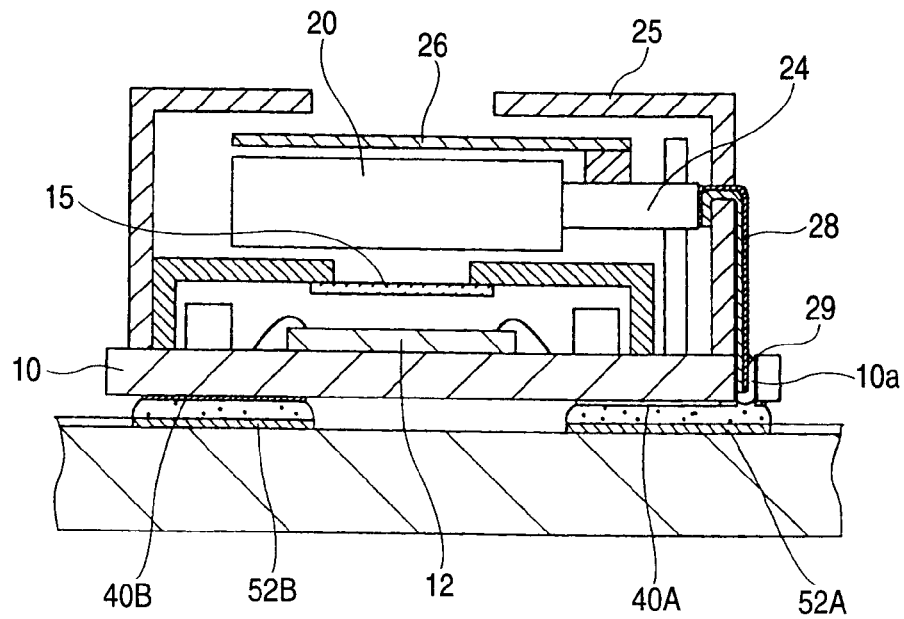
FIG. 8 is a cross-sectional view of an additional example mounting for the camera module.

FIG. 8 is a diagram showing an example wherein the flexible wiring board 28 is located along the external side face of the outer case 25, and the terminal portions 29 of the flexible wiring board 28 are inserted into terminal connection holes 10a, in the board 10, that are formed outside the outer case 25, and are used to connect the board 10 to the flexible wiring board 28. A conductive material 11, such as solder, is used to fill the terminal connection holes 10a and to hold the terminal portions 29 inside the terminal connection holes 10a, and the flexible wiring board 28 is electrically connected, via the conductive material 11, to the connection terminals 40A that are formed on the reverse face of the board 10. This configuration is the same as in the above embodiment.

In this example, a through hole penetrating the flexible wiring board is formed in the outer case 25, and the flexible wiring board 28 is extended outward through this hole. When the flexible wiring board 28 is located outside the outer case 25, as an advantage, the connection of the flexible wiring board 28 and the board 10 can be visually confirmed externally. Further, depending on the arrangement and the form of the autofocus unit 20 of the camera module 30, the configuration of the camera module 30 and the assembly operation may be simplified by employing the method whereby the flexible wiring board 28 is located outside the module.

According to the embodiment of the invention, the flexible wiring board 28 is provided for electrically connecting the board 10 to the driver that is incorporated in the autofocus unit 20, and the control mechanism for the shutter 26. However, when the shutter control mechanism is separately provided for a product, wiring patterns for electrifying the shutter control mechanism need not be formed for the flexible wiring board 28. In addition to the autofocus mechanism, when another control mechanism is incorporated, many more wiring patterns 28a may be formed.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

We claim:

1. A camera module comprising:
    an image pickup device;
    a camera optical system;
    a driver for aligning and focusing the camera optical system;
    a mounting board to which the image pickup device, the camera optical system and the driver are mounted; and
    a flexible wiring board,
    wherein a connection terminal, to be electrically connected to the driver, is formed on a mounting face of the mounting board which the image pickup device is directly mounted, and
    wherein the connection terminal formed on the mounting board is connected to the driver via the flexible wiring board.

2. A camera module according to claim 1, further comprising:
    a case attached to the mounting board, for storing the image pickup device, the camera optical system and the driver therein,
    wherein the flexible wiring board is arranged in the case.

3. A camera module according to claim 1, wherein the camera optical system and the driver are formed as an autofocus unit, and the driver that is incorporated in the autofocus unit and the connection terminal are electrically connected via the flexible wiring board.

4. A camera module according to claim 1, further comprising:
    a shutter; and
    a control mechanism for controlling the shutter,
    wherein a connection terminal, which is to be electrically connected to the control mechanism, is formed on the mounting face of the mounting board, and
    wherein the connection terminal and the control mechanism are electrically connected via the flexible wiring board.

5. A camera module according to claim 1, wherein the connection terminal is formed on the mounting face of the mounting board with the same plane arrangement as a connection electrode to be connected to the connection terminal formed on a mounting board on which the camera module is mounted.

6. A camera module according to claim 1, wherein terminal portions of the flexible wiring board project from an edge portion that is to be connected to terminal connection holes that are formed in the mounting board, and are inserted into the terminal connection holes; and wherein a wiring pattern that is formed on the flexible wiring board is electrically connected to the connection terminal via a conductive material that is used to fill the terminal connection holes.

7. A camera module comprising:
   an image pickup device;
   a camera optical system;
   a driver for aligning and focusing the camera optical system;
   a mounting board, with the image pickup device, the camera optical system, and the driver mounted thereon; and
   a flexible wiring board,
   wherein the camera optical system is mounted on the mounting board by an upright support rod and a mounting portion, wherein the upright support rod is mounted on the mounting board and extends therefrom, and the mounting portion extends perpendicularly from the upright rod,
   wherein a connection terminal, to be electrically connected to the driver, is formed on a mounting face of the mounting board which the image pickup device is directly mounted, and
   wherein the connection terminal formed on the mounting board is connected to the driver via the flexible wiring board, the flexible wiring board connecting to the driver by being engaging a driver terminal on an edge of the mounting portion in a position adjacent to the upright rod.

8. A camera module according to claim 7, further comprising:
   a case attached to the mounting board, for storing the image pickup device, the camera optical system and the driver therein,
   wherein the flexible wiring board is arranged along an outer wall of the case and enters the case through an opening in a sidewall of the case to connect to the mounting portion.

* * * * *